(12) United States Patent
Sawai et al.

(10) Patent No.: US 8,173,472 B2
(45) Date of Patent: May 8, 2012

(54) SEMICONDUCTOR SENSOR AND MANUFACTURING METHOD OF SENSOR BODY FOR SEMICONDUCTOR SENSOR

(75) Inventors: Tsutomu Sawai, Toyama (JP); Kazuya Komori, Toyama (JP)

(73) Assignee: Hokuriku Electric Industry Co., Ltd., Toyama-shi (JP)

( * ) Notice: Subject to any disclaimer, the term of this patent is extended or adjusted under 35 U.S.C. 154(b) by 0 days.

(21) Appl. No.: 13/012,172

(22) Filed: Jan. 24, 2011

(65) Prior Publication Data

US 2011/0117689 A1 May 19, 2011

Related U.S. Application Data

(62) Division of application No. 12/158,138, filed as application No. PCT/JP2006/325345 on Dec. 20, 2006, now abandoned.

(30) Foreign Application Priority Data

Dec. 20, 2005 (JP) ................................ 2005-366607

(51) Int. Cl.
*H01L 21/00* (2006.01)
(52) U.S. Cl. ............... 438/53; 257/419; 257/E29.324; 257/E21.221; 257/E21.232; 438/701; 438/702
(58) Field of Classification Search .................. 257/419, 257/E29.324, E21.214, E21.221, E21.231, 257/E21.232; 438/50, 53, 700–702
See application file for complete search history.

(56) References Cited

U.S. PATENT DOCUMENTS

| | | | |
|---|---|---|---|
| 4,699,006 A | 10/1987 | Boxenhorn | |
| 5,006,487 A | 4/1991 | Stokes | |
| 5,478,460 A * | 12/1995 | Sugama et al. | 438/49 |
| 5,759,870 A | 6/1998 | Yun et al. | |
| 5,899,750 A * | 5/1999 | Tanaka et al. | 438/753 |
| 6,093,579 A * | 7/2000 | Sathe | 438/53 |
| 6,140,143 A * | 10/2000 | Christel et al. | 438/53 |
| 6,673,694 B2 * | 1/2004 | Borenstein | 438/411 |
| 6,858,457 B2 * | 2/2005 | Yamaguchi et al. | 438/48 |
| 7,057,248 B2 | 6/2006 | Sautter et al. | |
| 2006/0094148 A1 | 5/2006 | Nakamizo et al. | |
| 2008/0123242 A1 | 5/2008 | Zhou | |
| 2008/0160659 A1 | 7/2008 | Craddock et al. | |

FOREIGN PATENT DOCUMENTS

| | | |
|---|---|---|
| JP | 05-256869 | 10/1993 |
| JP | 06-138141 | 5/1994 |
| JP | 09-126876 | 5/1997 |
| JP | 09-184850 | 7/1997 |
| JP | 10-132682 | 5/1998 |
| JP | 2005-049208 | 2/2005 |
| WO | 2004/114416 | 12/2004 |

\* cited by examiner

*Primary Examiner* — Allan R Wilson
(74) *Attorney, Agent, or Firm* — Rankin, Hill & Clark LLP (57) ABSTRACT

A semiconductor sensor of which the thickness may be reduced and a method of manufacturing a sensor body for the semiconductor sensor are provided. A total length L1 of a weight portion 5 and an additional weight portion 3 as measured in an extending direction of a centerline C is determined to be shorter than a length L2 of a support portion 7 as measured in the extending direction of the centerline C. The weight portion 5 and the additional weight portion 3 are received within a space 15 defined, being surrounded by the support portion 7. Then, dimensions and shapes of the weight portion 5 and the additional weight portion 3 are determined to allow the weight portion 5 and the additional weight portion 3 to move within the space 15.

6 Claims, 6 Drawing Sheets

SEMICONDUCTOR SENSOR AND MANUFACTURING METHOD OF SENSOR BODY FOR SEMICONDUCTOR SENSOR

The present invention is a divisional of U.S. patent application Ser. No. 12/158,138 filed on Jun. 19, 2008, now abandoned, filed as Application No. PCT/JP2006/325345 on Dec. 20. 2006, which claims priority to Japanese Patent Application No. 2005-366607 filed Dec. 20, 2005.

TECHNICAL FIELD

The present invention relates to a semiconductor sensor and a method of manufacturing a sensor body for the semiconductor sensor. More specifically, the present invention relates to a semiconductor sensor capable of measuring acceleration in a predetermined direction caused by force externally applied, and gravitational acceleration in a predetermined direction in a stationary state, which is applied by inclining the semiconductor sensor, or a semiconductor sensor used as a gyroscope, and a manufacturing method of a sensor body used for the semiconductor sensor.

BACKGROUND ART

Japanese Patent Application Publication No. 2004-125704 (Patent Document 1) discloses an example of semiconductor sensor including a sensor body, an additional weight portion, and a pedestal. The sensor body includes a weight portion disposed in a central portion thereof, a cylindrical support portion disposed in an outer peripheral portion thereof, and a diaphragm portion disposed between the weight portion and the support portion. Then, the support portion is supported by the cylindrical pedestal. The additional weight portion is fixed to an end of the weight portion and is arranged in a space surrounded by the pedestal and the support portion. In a semiconductor acceleration sensor of this type, based on acceleration caused by force externally applied or gravitational acceleration applied in a state where the sensor is inclined, the weight portion and the additional weight portion are moved, and the diaphragm portion is thereby distorted. Then, each sensor element formed on the diaphragm portion accordingly outputs a detection signal indicative of acceleration corresponding to the amount of distortion.
Patent Document 1: Japanese Patent Application Publication No. 2004-125704

DISCLOSURE OF THE INVENTION

Problem to be Solved by the Invention

In the conventional semiconductor sensor, however, the support portion is supported by the cylindrical pedestal. Accordingly, there is a limit to reducing the thickness of the semiconductor sensor including the size of the pedestal.

An object of the present invention is to provide a semiconductor sensor of which the thickness may be reduced, and a method of manufacturing a sensor body for the semiconductor sensor.

Another object of the present invention is to provide a semiconductor sensor which does not need a pedestal that supports a support portion and a method of manufacturing the semiconductor sensor.

Means for Solving the Problem

A semiconductor sensor, improvement of which is aimed at by the present invention comprises: a sensor body including a weight portion disposed in a central portion thereof, a cylindrical support portion disposed in an outer peripheral portion thereof, and a diaphragm portion disposed between the weight portion and the support portion; and an additional weight portion fixed to the weight portion so that a centerline passing through the center of the weight portion and extending in a direction orthogonal to an extending direction of the diaphragm portion passes through the center of gravity of the additional weight portion. In the present invention, the total length of the weight portion and the additional weight portion as measured in an extending direction of the centerline is shorter than the length of the support portion as measured in the extending direction of the centerline. Then, the weight portion and the additional weight portion have dimensions and shapes that allow movement thereof within a shape which is defined, being surrounded by the support portion. When the total length of the weight portion and the additional weight portion as measured in the extending direction of the centerline is defined to be shorter than the length of the support portion as measured in the extending direction of the centerline as in the present invention, the weight portion and the additional weight portion may be received within the space surrounded by the support portion. For this reason, it is not necessary to provide a pedestal that supports the support portion as in the conventional art, because the weight portion and the additional weight portion individually have the dimensions and shape that allow movement thereof within the space surrounded by the support portion. The number of components of the semiconductor sensor may be thereby reduced, so that the thickness of the semiconductor sensor may be reduced.

The additional weight portion may be structured to have an upper surface that faces a back surface of the diaphragm portion, a lower surface that opposes the upper surface in the extending direction of the centerline, and an outer peripheral surface located between the upper and lower surfaces. The outer peripheral surface faces the support portion. Here, preferably, a shape of an inner peripheral surface of the support portion that faces the additional weight portion and a shape of the additional weight portion are determined so that, when the additional weight portion is displaced toward the diaphragm portion by a predetermined amount, an outside corner portion formed between the outer peripheral surface and the upper surface of the additional weight portion comes to abut against the inner peripheral surface of the support portion, thereby limiting an amount of the displacement of the additional weight portion toward the diaphragm portion. With this arrangement, when acceleration is applied to the semiconductor sensor and then the additional weight portion is going to move more than necessary, the outside corner portion comes to abut against the inner peripheral surface of the support portion. The displacement amount of the additional weight portion is thereby limited within a predetermined range. For this reason, the diaphragm portion may be prevented from being broken or damaged due to the movement of the additional weight portion.

Another semiconductor sensor of the present invention comprises: a sensor body including a weight portion disposed in a central portion thereof, a cylindrical support portion disposed in an outer peripheral portion thereof, and a diaphragm portion disposed between the weight portion and the support portion. Then, the length of the weight portion as measured in an extending direction of a centerline is shorter than the length of the support portion as measured in the extending direction of the centerline. The weight portion has dimensions and a shape that allow movement thereof within a space surrounded by the support portion. In the semiconductor sensor of this type as well, it is not necessary to provide a pedestal that supports the support portion as in the conventional art. The number of components of the semiconductor sensor may be thereby reduced, so that the thickness of the semiconductor sensor may be reduced.

The sensor body used for a semiconductor sensor of the present invention may be manufactured as follows. First, an insulating layer is formed on one of the surfaces of the semiconductor substrate. The insulating layer is coated with a photosensitive resist, thereby forming a first unphotosensitized resist layer. Next, ultraviolet light is irradiated onto the first unphotosensitized resist layer through a photomask and then the irradiated first unphotosensitized resist layer is developed, thereby forming on the one surface of the semiconductor substrate a first resist layer having a first etching opening of a predetermined shape. The first resist layer covers a portion where the support portion is to be formed. Then, the insulating layer is etched through the first etching opening to remove the insulating layer located in a portion corresponding to the first etching opening, thereby forming a second etching opening in the insulating layer.

Next, the first resist layer is removed, and then anisotropic etching is applied to the semiconductor substrate through the second etching opening, thereby forming a concave portion in the semiconductor substrate.

Next, a wall surface insulating film is formed on an inner wall surface of the concave portion. Then, the wall surface insulating film and the insulating layer continuous with the wall surface insulating film are coated with a photosensitive resist, thereby forming a second unphotosensitized resist layer. Ultraviolet light is irradiated onto the second unphotosensitized resist layer through a photomask and then the irradiated second unphotosensitized resist layer is developed, thereby forming a second resist layer of a predetermined shape and a third resist layer. The second resist layer is located on a central location of the concave portion. The second resist layer has an area smaller than an area of a bottom surface of the concave portion and covers a portion where the weight portion is to be formed. The third resist layer covers the portion surrounding the concave portion where the support portion is to be formed. The second and third resist layers define a third etching opening therebetween.

Next, the wall surface insulating film is etched through the third etching opening, thereby forming a fourth annular etching opening in the wall surface insulating film. Then, after removing the second and third resist layers, anisotropic etching is applied to the semiconductor substrate through the fourth etching opening, thereby forming an annular concave portion in a portion of the semiconductor substrate located on a bottom of the concave portion. Then, the diaphragm portion is defined by a portion of the semiconductor substrate that corresponds to a bottom surface of the annular concave portion, and the weight portion is defined by the portion of the semiconductor substrate that is left on a central location of the annular concave portion.

With this arrangement, such sensor body may readily be formed so as to have the length of the weight portion in the extending direction of the centerline which is shorter than the length of the support portion in the extending direction of the centerline.

Wet etching or dry etching may be employed.

The insulating layer may be of a two-layered structure, comprising a silicon oxide film formed by thermally oxidizing the surface of the semiconductor substrate and a silicon nitride film formed on the silicon oxide film by thin-film formation technique, for example. With this arrangement, adhesion of the silicon nitride film to the semiconductor substrate is improved.

The wall surface insulating film may be formed of a silicon nitride film formed by thin-film formation technique.

The process of irradiating ultraviolet light onto the second unphotosensitized resist layer through the photomask may comprise two steps, a first irradiation step and a second irradiation step. In the first irradiation step, the ultraviolet light is irradiated onto the second unphotosensitized resist layer through a first negative photomask, thereby cross-linking a portion of the second unphotosensitized resist layer where the support portion is to be formed. In the second irradiation step, the ultraviolet light is irradiated onto the second unphotosensitized resist layer through a second negative photomask after or before the first irradiation step, thereby cross-linking a portion of the second unphotosensitized resist layer where the weight portion is to be formed. With this arrangement, the second and third resist layers of accurate shapes and dimensions may be formed.

The first negative photomask may comprise: a main portion through which the ultraviolet light passes, and a mask portion formed on a central location of an opposing surface of the main portion that faces the second unphotosensitized resist layer. The mask portion may be so formed that the ultraviolet light is not irradiated onto a portion of the second unphotosensitized resist layer other than a portion of the second unphotosensitized resist layer where the support portion is to be formed.

The second negative photomask may comprise a main portion, a first mask portion, and a second mask portion.

The main portion includes a base portion that faces the second unphotosensitized resist layer, and a projecting portion having a shape that projects from the base portion along an inner wall surface of the concave portion. The ultraviolet light passes through the main portion. The first mask portion is annularly formed on an irradiation surface of the base portion onto which the ultraviolet light is to be irradiated. The second mask portion is annularly formed on a location of an opposing surface of the projecting portion that faces the second unphotosensitized resist layer and faces the bottom surface of the concave portion. The second mask portion is formed so that the ultraviolet light that has entered through a portion where the first mask portion is not formed is not irradiated onto portions of the second unphotosensitized resist layer other than a portion of the second unphotosensitized resist layer where the weight portion is to be formed.

BEST MODE FOR CARRYING OUT THE INVENTION

Figure 1:
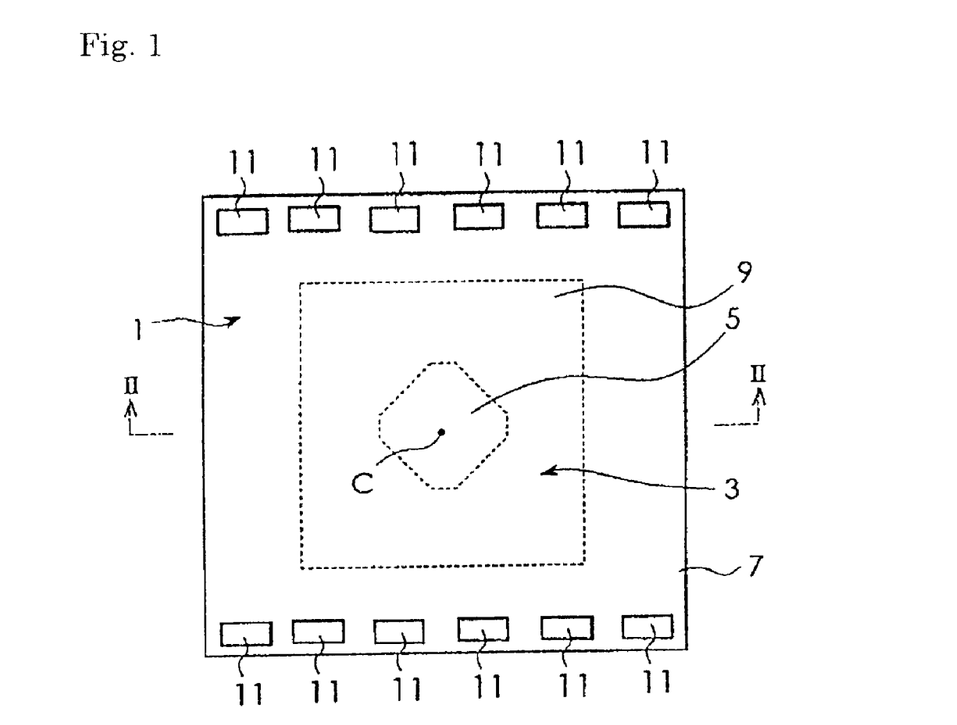
FIG. 1 is a plan view of a semiconductor sensor according to a first embodiment of the present invention.
Figure 2:
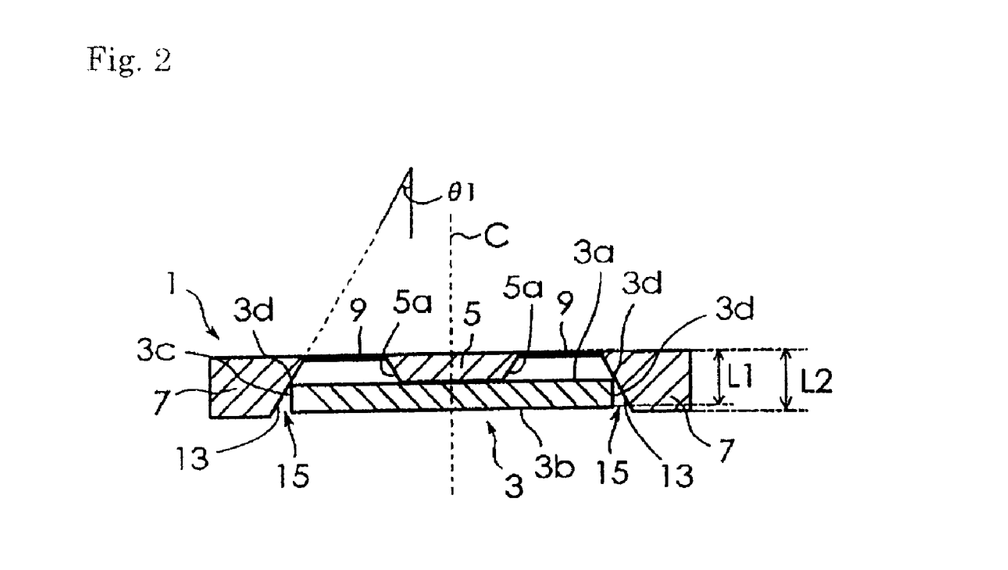
FIG. 2 is a sectional view taken along line II-II of FIG. 1.

Embodiments of the present invention will be described in detail with reference to accompanying drawings. FIG. 1 is a plan view of a semiconductor sensor in an embodiment (a first embodiment) of the present invention that has been applied to an acceleration sensor. FIG. 2 is a sectional view taken along line II-II of FIG. 1. As shown in the figures, the semiconductor sensor in this embodiment includes a sensor body 1 and an additional weight portion 3 fixed onto the sensor body 1.

The sensor body 1 is formed by applying anisotropic etching to a semiconductor crystal substrate formed of single-crystal silicon so that a weight portion 5 is disposed in a central portion of the sensor body 1, a cylindrical support portion 7 is disposed in an outer peripheral portion of the sensor body 1, and a diaphragm portion 9 having flexibility is defined between the weight portion 5 and the support portion 7. On at least one of the diaphragm portion 9 and the support portion 7 on a surface of the sensor body 1, a plurality of sensor elements not shown are formed. The sensor elements are formed of diffused resistors for acceleration detection. A plurality of electrodes 11 are formed on the support portion 7. In the semiconductor sensor in this embodiment, the weight portion 5 and the additional weight portion 3 are moved by force based on acceleration caused by force applied externally or gravitational acceleration applied in an inclined stationary state of the semiconductor sensor. The diaphragm portion 9 is thereby flexed. Resistance values of the respective diffused resistors constituting the sensor elements are changed, thereby detecting the acceleration in three axial directions corresponding to an amount of distortion.

The weight portion 5 is shaped to project from the diaphragm portion 9. The direction where the weight portion 5 projects is opposite to a direction toward a surface of the support portion 7 on which electrodes 11 are provided (or a direction toward the back surface of the diaphragm portion 9). The weight portion 5 has a cross sectional surface of a polygon. A virtual line that passes through the center of the weight portion 5 and extends in a direction orthogonal to a direction in which the diaphragm portion 9 extends is indicated by a virtual centerline C. An outer peripheral surface 5a of the weight portion 5 centering on the centerline C is inclined so that the further the outer peripheral surface 5a is away from the diaphragm portion 9, the closer the outer peripheral surface 5a is to the centerline C. Then, the total length L1 of the weight portion 5 and the additional weight portion 3 as measured in an extending direction of the centerline C is shorter than the length L2 of the support portion 7 as measured in the extending direction of the centerline C, which will be described later.

The support portion 7 has a rectangular annular shape. An inner peripheral surface 13 of the support portion 7 that faces the additional weight portion 3 is structured by an annular arrangement of four trapezoidal inclined surfaces of substantially the same shape so as to follow the outer peripheral surface of a frust-pyramidal or truncated pyramid space defined by the support portion 7. The inner peripheral surface 13 is so inclined that the further the inner peripheral surface 13 is away from the diaphragm portion 9, the further the inner peripheral surface 13 is apart from the centerline C. In this embodiment, an inclination angle θ1 of the inner peripheral surface 13 with respect to the centerline C is 36 degrees. With such a structure of the inner peripheral surface 13 of the support portion 7, a space 15 containing the weight portion 5, surrounded by the support portion 7 has a frust-pyramidal or truncated pyramid shape of which the cross sectional area is reduced more toward the diaphragm portion 9.

The additional weight portion 3 is shaped like a circular plate, and is formed of tungsten. This additional weight portion 3 includes an upper surface 3a shaped like a circular plate, which extends along the diaphragm portion 9 and faces the back surface of the diaphragm portion 9, a lower surface 3b that opposes the upper surface 3a in the extending direction of the centerline C, and an outer peripheral surface 3c located between the upper surface 3a and the lower surface 3b. The outer peripheral surface 3c faces the support portion 7. For this reason, an outside corner portion 3d is formed between the outer peripheral surface 3c and the upper surface 3a. The outside corner portion 3d has a crossing angle of 90 degrees between the outer peripheral surface 3c and the upper surface 3a. Then, the central portion of the upper surface 3a is fixed to the bottom of the weight portion 5 using an adhesive. This additional weight portion 3 is fixed onto the weight portion 5 so that the centerline C of the weight portion 5 passes through the center of gravity of the additional weight portion 3. The weight portion 5 and the additional weight portion 3 are received in the space 15 surrounded by the support portion 7. Then, the weight portion 5 and the additional weight portion 3 have dimensions and shapes that allow movement thereof within the space 15. In this embodiment, when the additional weight portion 3 is going to move more than necessary, the outside corner portion 3d comes to abut against the inner peripheral surface 13 of the support portion 7. A displacement amount of the additional weight portion 3 is thereby limited within a predetermined range.

A manufacturing method of the sensor body 1 used in the semiconductor sensor in this embodiment will be described with reference to FIGS. 3A to 3F and FIGS. 4A to 4E.

Figure 3:
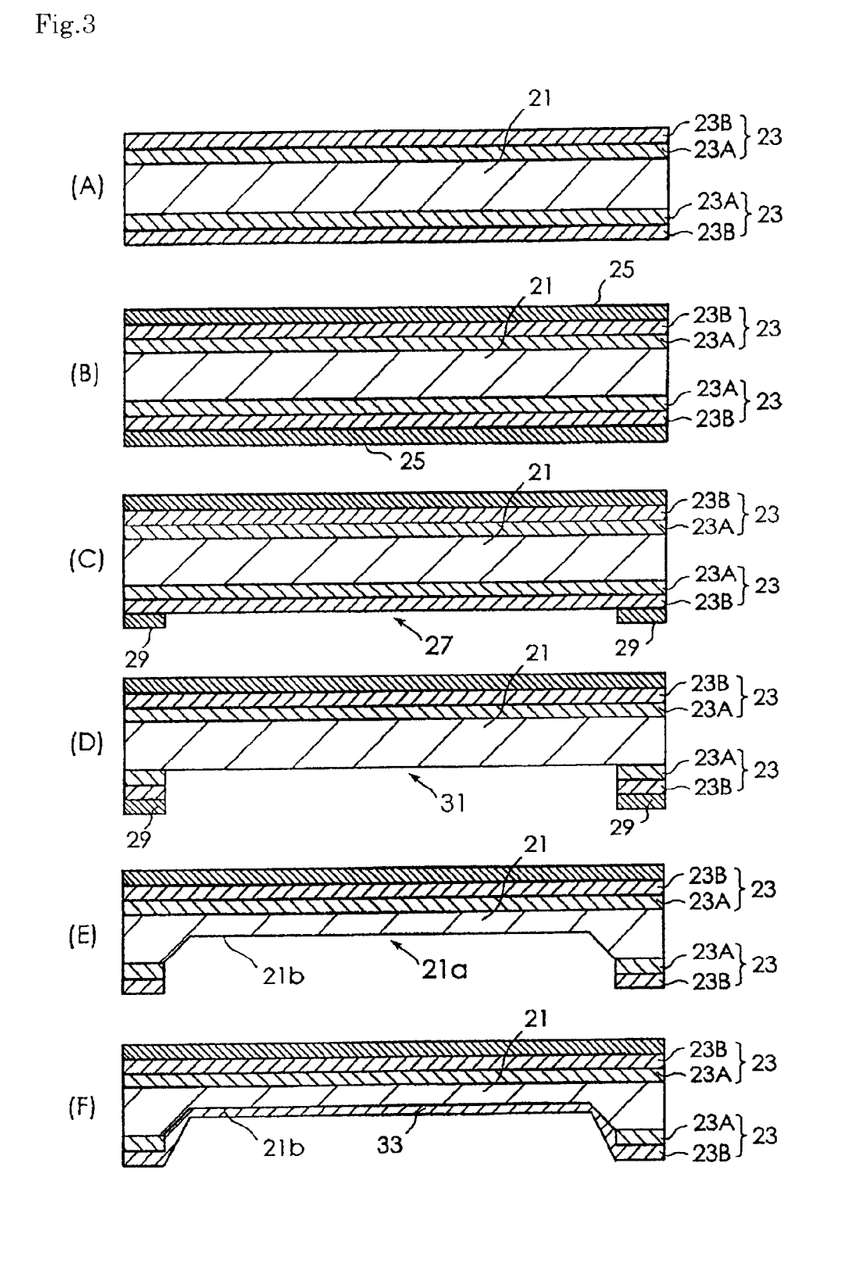
FIGS. 3A to 3F are used for explaining a method of manufacturing a sensor body for the semiconductor sensor shown in FIG. 1.

First, as shown in FIG. 3A, an insulating layer 23 is formed each on both surfaces of the semiconductor substrate 21. The insulating layer 23 may be formed of a single layer or multiple layers. In this embodiment, the insulating layer 23 is of a two-layered structure, comprising a silicon oxide film ($SiO_2$ film) 23A formed by thermally oxidizing the surface of the semiconductor substrate 21 and a silicon nitride film ($Si_3N_4$ film) 23B formed on the silicon oxide film 23A by thin-film formation technique.

Next, as shown in FIG. 3B, a first unphotosensitized resist layer 25 is formed by coating the insulating layer 23 with a photosensitive resist. Then, as shown in FIG. 3C, a first resist layer 29 having a first etching opening 27 of a predetermined shape is formed on one surface of the semiconductor substrate 21 (which is the lower surface in the page of FIG. 3C) after ultraviolet light has been irradiated onto the first unphotosensitized resist layer 25 through a first photomask and then the irradiated first unphotosensitized layer has been developed. The first resist layer 29 covers a portion where the support portion 7 is to be formed in a subsequent step. Next, as shown in FIG. 3D, the insulating layer is etched through the first etching opening 27, using a wet etching solution, to remove a portion of the insulating layer 23 that corresponds to the first etching opening 27. A second etching opening 31 is thereby formed in the insulating layer 23. In this embodiment, for the silicon nitride film ($Si_3N_4$ film) 23B, phosphoric acid is used as a wet etching solution. Then, for the silicon oxide film ($SiO_2$ film) 23A, an aqueous solution of buffered hydrofluoric acid is employed as a wet etching solution. Then, the first resist layer 29 is removed.

Next, as shown in FIG. 3E, anisotropic etching is applied to the semiconductor substrate through the second etching opening 31, using an anisotropic etching solution. A concave portion 21a is thereby formed in the semiconductor substrate 21. In this embodiment, an aqueous solution of KOH is employed as an anisotropic etching solution. Next, as shown in FIG. 3F, a wall surface insulating film 33 is formed on an inner peripheral surface 21b of the concave portion 21a. In this embodiment, the wall surface insulating film 33 is formed of the silicon nitride film ($Si_3N_4$ film) formed by thin-film formation technique.

Figure 4:
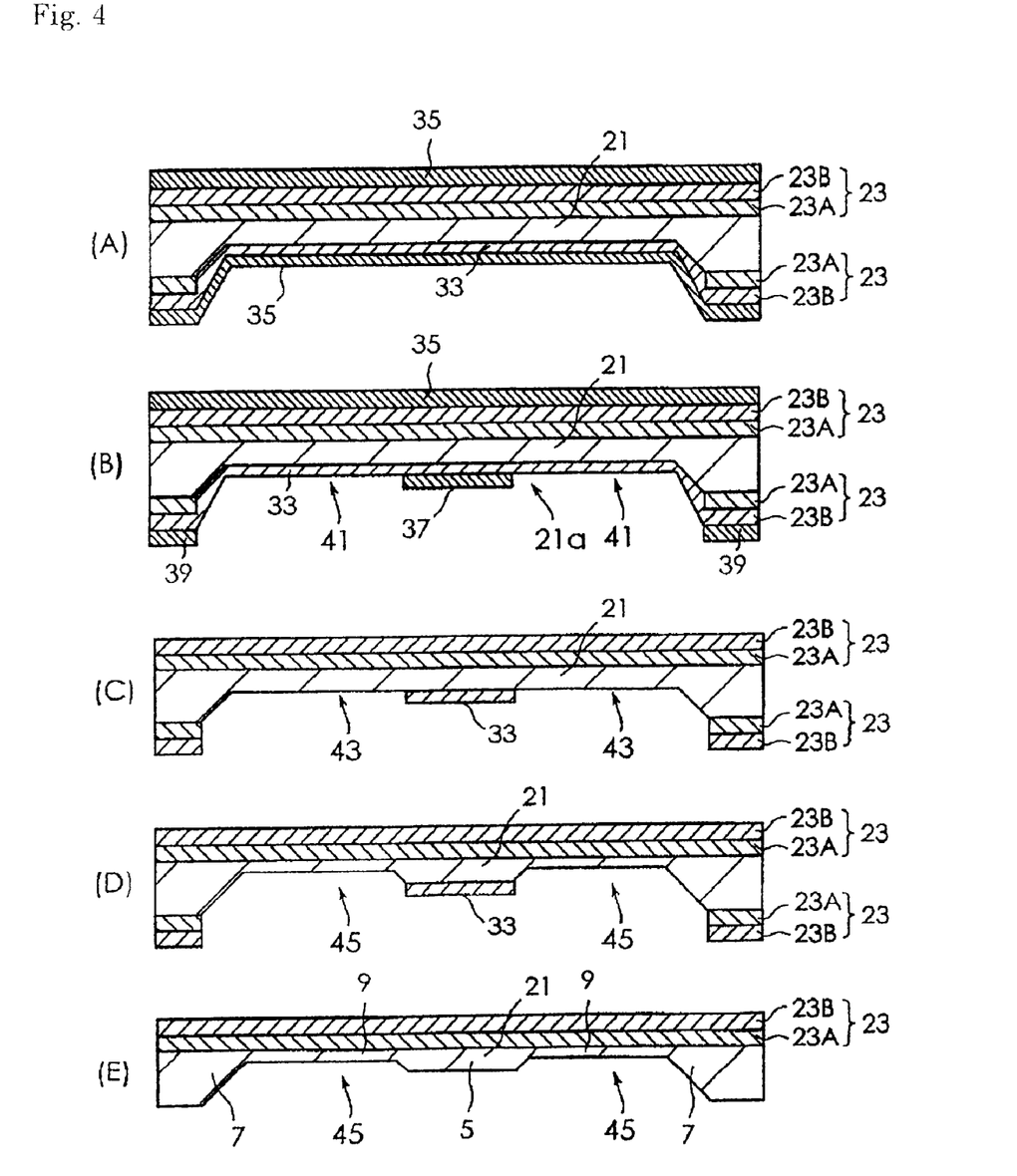
FIGS. 4A to 4E are used for explaining the method of manufacturing the sensor body for the semiconductor sensor shown in FIG. 1.

Next, as shown in FIG. 4A, the wall surface insulating film 33 and the insulating layer 23 that is continuous with the wall surface insulating film 33 are coated with a photosensitive resist, thereby forming a second unphotosensitized resist layer 35. In this embodiment, the unphotosensitized resist layers 35 are formed each on the entire upper and lower surfaces of the semiconductor substrate 21. Next, as shown in FIG. 4B, ultraviolet light is irradiated onto the second unphotosensitized resist layer 35, thereby forming a second resist layer 37 of a predetermined shape and a third resist layer 39. The second resist layer 37 is disposed on a central location of the concave portion 21a. The second resist layer 37 has an area smaller than an area of a bottom surface of the concave portion 21a. The third resist layer 39 covers the insulating layer 23 around the concave portion 21a. The second resist layer 37 covers a portion where the weight portion 5 is to be formed in a subsequent step, while the third resist layer 39 covers the portion where the support portion 7 is to be formed. The second and third resist layers define a third etching opening 41 therebetween.

Figure 5:
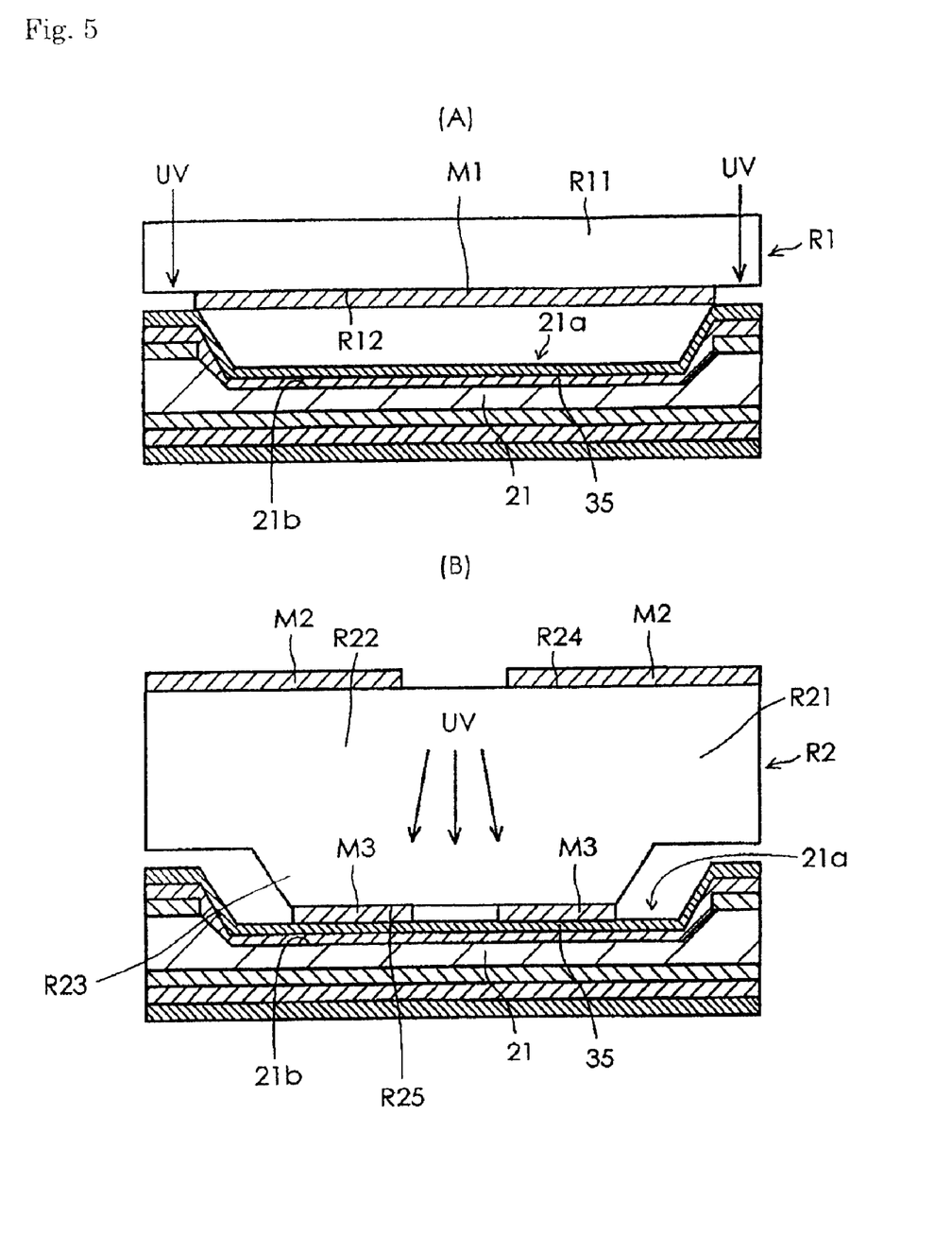
FIGS. 5A and 5B are used for explaining in detail steps of forming second and third resist layers in the manufacturing method of the sensor body shown in FIGS. 4A to 4E.

In this embodiment, the ultraviolet light is irradiated in the following manner. First, a first negative photomask R1 is prepared, as shown in FIG. 5A. The first negative photomask R1 has a main portion R11 and a mask portion M1. The main portion R11 is formed of glass, through which the ultraviolet light passes. The mask portion M1 is formed on a central portion of an opposing surface R12 of the main portion R11. The opposing surface R12 faces the second unphotosensitized resist layer 35. The mask portion M1 is shaped so that ultraviolet light UV which has entered the main body portion R11 is masked and is not irradiated onto portions of the second unphotosensitized resist layer 35 other than a portion of the second unphotosensitized resist layer 35 around the concave portion 21a (portion where the support portion 7 is to be formed in a subsequent step). Then, the ultraviolet light UV is irradiated onto the second unphotosensitized resist layer 35 through the first negative photomask R1. With this arrangement, the portion of the second unphotosensitized resist layer 35 where the support portion 7 is to be formed is cross-linked (in a first irradiation step).

Next, as shown in FIG. 5B, a second negative photomask R2 is prepared. The second negative photomask R2 also has a main portion R21 formed of glass, through which the ultraviolet light passes. The main portion R21 has a base portion R22 that faces the second unphotosensitized resist layer 35, and a projecting portion R23 shaped to project from the base portion R22 along the inner wall surface of the concave portion 21a. A first annular mask portion M2 is formed on an irradiation surface R24 of the base portion R22 onto which the ultraviolet light is to be irradiated. A second annular mask portion M3 is formed on an opposing surface R25 of the projecting portion R23 that faces the second unphotosensitized resist layer 35. The second annular mask portion M3 is shaped so that the ultraviolet light UV which has entered through a portion where the first mask portion M2 is not provided is masked and is not irradiated onto portions of the second unphotosensitized resist layer 35 other than a portion of the second unphotosensitized resist layer 35 where the weight portion 5 is to be formed. Then, the ultraviolet light UV is irradiated onto the second unphotosensitized resist layer 35 through the second negative photomask R2. With this arrangement, the weight portion 5 of the second unphotosensitized resist layer 35 is cross-linked (in a second irradiation step).

Next, using a developing solution, a portion of the second unphotosensitized resist layer 35 between a central portion of the concave portion 21a and a peripheral portion of the concave portion 21a (portion onto which the ultraviolet light UV is not irradiated and which is not therefore cross-linked) is removed. In the embodiment described above, after cross-linking the portion of the second unphotosensitized resist layer 35 where the support portion is to be formed, the portion where the weight portion 5 to be formed is cross-linked. The order in which the first irradiation step and the second irradiation step are performed may be reversed. After cross-linking the portion of the second unphotosensitized resist layer 35 where the weight portion 5 is to be formed, the portion where the support portion 7 is to be formed may be cross-linked.

When a material that decomposes by ultraviolet light is employed for the second unphotosensitized resist layer 35, a positive photomask should be employed.

Figure 6:
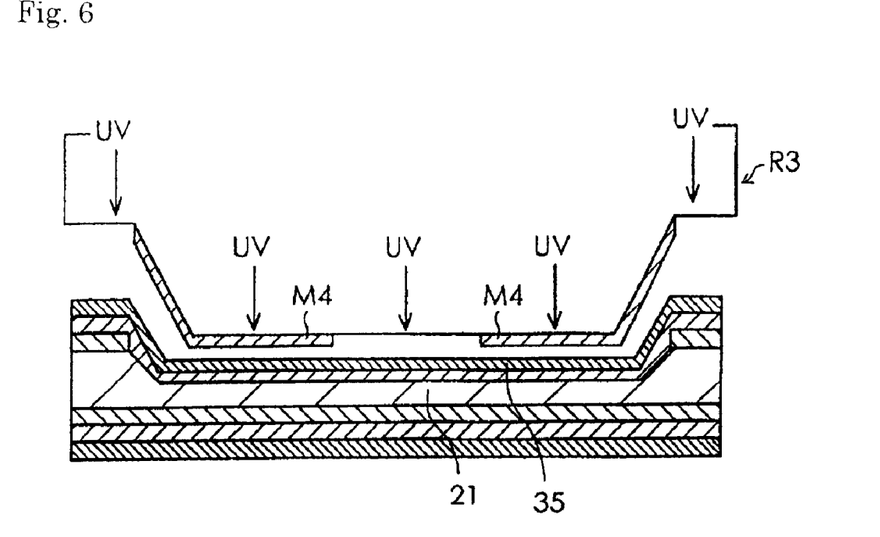
FIG. 6 is used for explaining a further step of forming the second and third resist layers in the manufacturing method of the sensor body shown in FIG. 4.

The ultraviolet light may also be irradiated, using a negative photomask R3 as shown in FIG. 6. On the negative photomask R3, mask portions M4 are formed so that the ultraviolet light is not irradiated onto the portions of the second unphotosensitized resist layer 35 other than portions of the second unphotosensitized resist layer corresponding to the central and surrounding portions of the concave portion 21a.

Next, as shown in FIG. 4C, the wall surface insulating film is etched through the third etching opening 41, using a wet etching solution. A fourth annular etching opening 43 is thereby formed in the wall surface insulating film 33. Then, the second resist layer 37 and the third resist layer 39 are removed.

Next, as shown in FIG. 4D, anisotropic etching is applied to the semiconductor substrate through the fourth etching opening 43, using an anisotropic etching solution, thereby forming an annular concave portion 45 in a portion of the semiconductor substrate 21 located on a bottom of the concave portion 21a. Then, as shown in FIG. 4E, the wall surface insulating film 33 and the insulating layer 23 on a bottom of the support portion 7 are removed. Then, the diaphragm portion 9 is defined by a portion of the semiconductor substrate 21 that corresponds to a bottom surface of the annular concave portion 45, and the weight portion 5 is defined by a portion of the semiconductor substrate 21 that is left on a central location of the annular concave portion 45, thereby completing the formation of the sensor body for a semiconductor sensor.

According to the semiconductor sensor in this embodiment, the total length L1 of the weight portion 5 and the additional weight portion 3 as measured in the extending direction of the centerline C is shorter than the length L2 of the support portion 7 as measured in the extending direction of the centerline C. Accordingly, the weight portion 5 and the additional weight portion 3 may be received within the space 15 surrounded by the support portion 7. For this reason, the weight portion 5 and the additional weight portion 3 have the dimensions and shapes that allow movement thereof within the space 15. Thus, it is not necessary to provide a pedestal that supports the support portion as in the conventional art.

The number of components of the semiconductor sensor may be thereby reduced, so that the thickness of the semiconductor sensor may be reduced.

Figure 7:
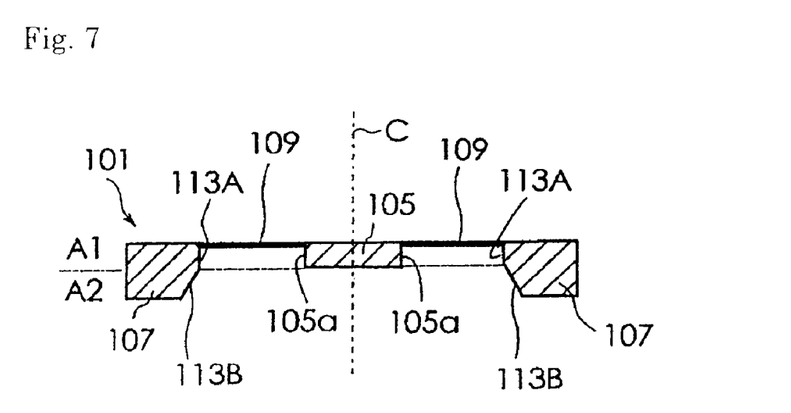
FIG. 7 is a sectional view of a semiconductor sensor according to a second embodiment of the present invention.

FIG. 7 is a sectional view of a semiconductor sensor in a second embodiment of the present invention. In this embodiment, reference numerals obtained by adding 100 to reference numerals used in the first embodiment are employed for components corresponding to those in the first embodiment, respectively. The semiconductor sensor in this embodiment is structured by a sensor body 101 alone. The sensor body 101 includes a weight portion 105 disposed in a central portion thereof, a cylindrical support portion 107 disposed in an outer peripheral portion thereof, and a diaphragm portion 109 disposed between the weight portion 105 and the support portion 107. The length of the weight portion 105 as measured in an extending direction of the centerline C is shorter than the length of the support portion 107 as measured in the extending direction of the centerline C. Then, the weight portion 105 has dimensions and a shape that allow movement thereof within a space 115 surrounded by the support portion 107.

An outer peripheral surface 105a of the weight portion 105, centering on the centerline C, extends in parallel with the centerline C.

An inner peripheral surface 113A of the support portion 107 in a region A1 that faces the weight portion 105 extends in parallel with the centerline C. An inner peripheral surface 113B of the support portion 107 in a region A2 that does not face the weight portion 105 is inclined so that the further the inner peripheral surface 113B is away from the diaphragm portion 109, the further the inner peripheral surface 113B is apart from the centerline C.

Figure 8:
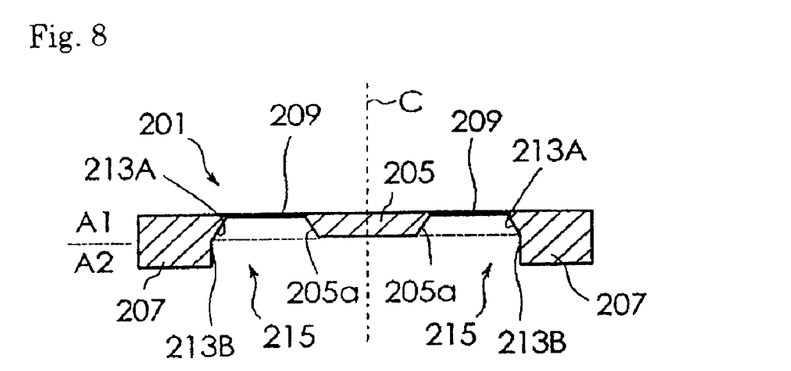
FIG. 8 is a sectional view of a semiconductor sensor according to a third embodiment of the present invention.

In the semiconductor sensor in this embodiment, dry etching is employed for etching applied to the region A1, wet etching for etching applied to the region A2. FIG. 8 is a sectional view of a semiconductor sensor in a third embodiment of the present invention. In this embodiment, reference numerals obtained by adding 200 to the reference numerals used in the first embodiment are employed for components corresponding to those in the first embodiment, respectively. The semiconductor sensor in this embodiment is also structured by a sensor body 201 alone. In the semiconductor sensor in this embodiment, an outer peripheral surface 205a of a weight portion 205, centering on the centerline C, is inclined so that the further the outer peripheral surface 205a is away from a diaphragm portion 209, the closer the outer peripheral surface 205a is to the centerline C.

An inner peripheral surface 213A of a support portion 207 in the region A1 that faces the weight portion 205 is inclined so that the further the inner peripheral surface 213A is away from the diaphragm portion 209, the further inner peripheral surface 213A is apart from the centerline C. An inner peripheral surface 213B of the support portion 207 in a region A2 that does not face the weight portion 205 extends in parallel with the centerline C.

In the semiconductor sensor in this embodiment, wet etching is employed for etching applied to the region A1, and dry etching for etching applied to the region A2.

Figure 9:
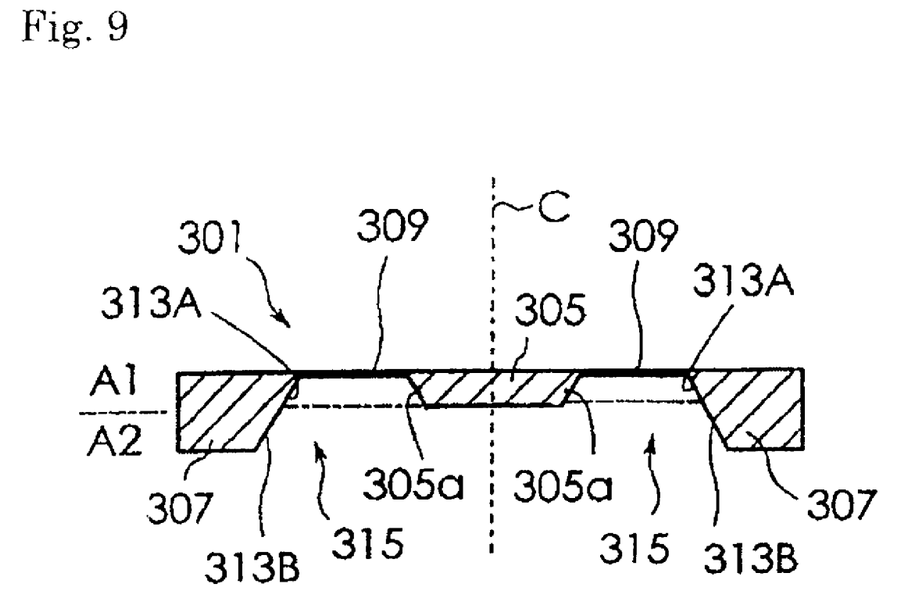
FIG. 9 is a sectional view of a semiconductor sensor according to a fourth embodiment of the present invention.

FIG. 9 is a sectional view of a semiconductor sensor in a fourth embodiment of the present invention. In this embodiment, reference numerals obtained by adding 300 to the reference numerals used in the first embodiment are employed for components corresponding to those in the first embodiment, respectively. The semiconductor sensor in this embodiment is also structured by a sensor body 301 alone. In the semiconductor sensor in this embodiment, an outer peripheral surface 305a of a weight portion 305, centering on the centerline C, is inclined so that the further the outer peripheral surface 305a is away from a diaphragm portion 309, the closer the outer peripheral surface 305a is to the centerline C.

An inner peripheral surface 313A of a support portion 307 in the region A1 that faces the weight portion 305 is inclined so that the further the inner peripheral surface 313A is away from the diaphragm portion 309, the further the inner peripheral surface 313A is apart from the centerline C. An inner peripheral surface 313B of the support portion 307 in the region A2 that does not face the weight portion 305 is continuous with the inner peripheral surface 313A, and is also inclined so that the further the inner peripheral surface 313B is away from the diaphragm portion 309, the further the inner peripheral surface 313B is apart from the centerline C.

In the semiconductor sensor in this embodiment, wet etching is employed for etching applied to the regions A1 and A2.

The invention claimed is:

1. A method of manufacturing a sensor body for a semiconductor sensor by etching a semiconductor substrate, the sensor body including a weight portion disposed in a central portion thereof, a cylindrical support portion disposed in an outer peripheral portion thereof, and a diaphragm portion disposed between the weight portion and the support portion, the method comprising:

forming an insulating layer on one surface of the semiconductor substrate;

coating the insulating layer with a photosensitive resist, thereby forming a first unphotosensitized resist layer;

irradiating ultraviolet light onto the first unphotosensitized resist layer through a photomask and then developing the irradiated first unphotosensitized resist layer, thereby forming on the one surface of the semiconductor substrate a first resist layer having a first etching opening of a predetermined shape, the first resist layer covering a portion where the support portion is to be formed;

etching the insulating layer through the first etching opening to remove a portion of the insulating layer that corresponds to the first etching opening, thereby forming a second etching opening in the insulating layer;

removing the first resist layer and then applying anisotropic etching to the semiconductor substrate through the second etching opening, thereby forming a concave portion in the semiconductor substrate;

forming a wall surface insulating film on an inner wall surface of the concave portion;

coating the wall surface insulating film and the insulating layer continuous with the wall surface insulating film with a photosensitive resist, thereby forming a second unphotosensitized resist layer;

irradiating ultraviolet light onto the second unphotosensitized resist layer through a photomask and then developing the irradiated second unphotosensitized resist layer, thereby forming a second resist layer of a predetermined shape and a third resist layer, the second resist layer being disposed on a central location of the concave portion, having a smaller area than an area of a bottom surface of the concave portion, and covering a portion where the weight portion is to be formed, the third resist layer covering a portion located around the concave portion, where the support portion is to be formed, the second and third resist layers defining a third etching opening therebetween;

etching the wall surface insulating film through the third etching opening, thereby forming a fourth annular etching opening in the wall surface insulating film; and removing the second and third resist layers and then applying anisotropic etching to the semiconductor substrate through the fourth etching opening, thereby forming an annular concave portion in a portion of the semiconductor substrate located on a bottom of the concave portion, wherein the diaphragm portion is defined by a portion of the semiconductor substrate corresponding to a bottom surface of the annular concave portion, and the weight portion is defined by the portion of the semiconductor substrate that is left on a central location of the annular concave portion.

2. The method of manufacturing a sensor body for a semiconductor sensor according to claim 1, wherein
the insulating layer is of a two-layered structure comprising a silicon oxide film formed by thermally oxidizing the one surface of the semiconductor substrate and a silicon nitride film formed on the silicon oxide film by thin-film formation technique.

3. The method of manufacturing a sensor body for a semiconductor sensor according to claim 1, wherein
the wall surface insulating film is formed of a silicon nitride film formed by thin-film formation technique.

4. The method of manufacturing a sensor body for a semiconductor sensor according to claim 1, wherein
irradiation of the ultraviolet light performed onto the second unphotosensitized resist layer through the photomask comprises:
a first irradiation step of irradiating the ultraviolet light onto the second unphotosensitized resist layer through a first negative photomask, thereby cross-linking a portion of the second unphotosensitized resist layer where the support portion is to be formed; and
a second irradiation step of irradiating the ultraviolet light onto the second unphotosensitized resist layer through a second negative photomask after or before the first irradiation step, thereby cross-linking a portion of the second unphotosensitized resist layer where the weight portion is to be formed.

5. The method of manufacturing a sensor body for a semiconductor sensor according to claim 1, wherein
the first negative photomask comprises:
a main portion through which the ultraviolet light passes; and
a mask portion that is formed on a central location of an opposing surface of the main portion that faces the second unphotosensitized resist layer so that the ultraviolet light is not irradiated onto portions of the second unphotosensitized resist layer other than a portion of the second unphotosensitized resist layer where the support portion is to be formed; and
the second negative photomask comprises:
a main portion including a base portion that faces the second unphotosensitized resist layer, and a projecting portion shaped to project from the base portion along an inner wall surface of the concave portion, the ultraviolet light passing through the main portion;
a first mask portion annularly formed on an irradiation surface of the base portion onto which the ultraviolet light is to be irradiated; and
a second mask portion annularly formed on a portion of an opposing surface of the projecting portion that faces the second unphotosensitized layer and faces the bottom surface of the concave portion, so that the ultraviolet light that has entered through a portion where the first mask portion is not formed is not irradiated onto portions of the second unphotosensitized portion other than a portion of the second unphotosensitized resist layer where the weight portion is to be formed.

6. The sensor body for a semiconductor sensor manufactured by the manufacturing method according to claim 1.

* * * * *